United States Patent
Wang et al.

(10) Patent No.: US 12,149,261 B2
(45) Date of Patent: Nov. 19, 2024

(54) METHODS AND APPARATUS FOR POLAR ENCODING

(71) Applicant: Huawei Technologies Co., Ltd., Guangdong (CN)

(72) Inventors: Xianbin Wang, Hangzhou (CN); Rong Li, Hangzhou (CN); Huazi Zhang, Hangzhou (CN); Shengchen Dai, Hangzhou (CN); Jiajie Tong, Hangzhou (CN); Yunfei Qiao, Hangzhou (CN); Jun Wang, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 18/317,259

(22) Filed: May 15, 2023

(65) Prior Publication Data

US 2023/0283299 A1    Sep. 7, 2023

Related U.S. Application Data

(63) Continuation of application No. PCT/CN2021/104427, filed on Jul. 5, 2021.

(30) Foreign Application Priority Data

Nov. 16, 2020  (CN) .......................... 202011276780.4

(51) Int. Cl.
   *H03M 13/13*    (2006.01)
   *H04L 1/1607*   (2023.01)
   *H04L 5/00*     (2006.01)

(52) U.S. Cl.
   CPC .......... *H03M 13/13* (2013.01); *H04L 1/1621* (2013.01); *H04L 5/0048* (2013.01)

(58) Field of Classification Search
   None
   See application file for complete search history.

(56) References Cited

U.S. PATENT DOCUMENTS

| 2019/0296769 A1* | 9/2019 | Zhang | H03M 13/2707 |
| 2020/0083912 A1* | 3/2020 | Chen | H04L 1/0057 |

FOREIGN PATENT DOCUMENTS

| BR | 112019019980 A2 * | 4/2020 | H04L 1/0013 |
| CN | 107342842 A * | 11/2017 | H03M 13/13 |

(Continued)

OTHER PUBLICATIONS

He Gaoning et al:"Beta-Expansion:A Theoretical Framework for Fast and Recursive Construction of Polar Codes", Globecom 2017, Dec. 4, 2017, total 6 pages, XP033299889.

*Primary Examiner* — Guerrier Merant
(74) *Attorney, Agent, or Firm* — WOMBLE BOND DICKINSON (US) LLP

(57) ABSTRACT

This application provides a polar encoding method and apparatus. The method can include obtaining a basic sequence, where the basic sequence includes $N_0$ subchannel numbers. The method can also include sequentially reading first subchannel numbers from the basic sequence, and sequentially reading $2^m$ second subchannel numbers from the basic sequence starting from an $M^{th}$ subchannel number based on the first subchannel number read each time; and adding $q*N_0$ to each of the $2^m$ second subchannel numbers to obtain $2^m$ third subchannel numbers. Furthermore, the method can include constructing a polar code by using subchannels corresponding to the $2^m$ third subchannel numbers as information bits. A polar code with another code length is constructed based on a sequence with a length of $N_0$. A length of a polar code that needs to be stored is therefore reduced, which reduces complexity and is also easy to implement.

17 Claims, 5 Drawing Sheets

(56) References Cited

FOREIGN PATENT DOCUMENTS

| | | | | |
|---|---|---|---|---|
| CN | 108599891 A | * | 9/2018 | ............ H03M 13/13 |
| CN | 109150384 A | * | 1/2019 | ............ H03M 13/13 |
| EP | 3570472 A1 | | 11/2019 | |
| WO | WO-2017092543 A1 | * | 6/2017 | ............ H03M 13/13 |
| WO | WO-2018028351 A1 | * | 2/2018 | ............ H03M 13/13 |
| WO | WO-2018127155 A1 | * | 7/2018 | |
| WO | WO-2018161941 A1 | * | 9/2018 | ............... H04B 7/26 |
| WO | WO-2018166423 A1 | * | 9/2018 | ............ H03M 13/09 |

* cited by examiner

500

```
┌─────────────────────────────────────────────────────────────────┐
│ Obtain a basic sequence, where the basic sequence includes $N_0$ subchannel │  S510
│                            numbers                              │
└─────────────────────────────────────────────────────────────────┘
                                  │
┌─────────────────────────────────────────────────────────────────┐
│  Sequentially read first subchannel numbers from the basic sequence │  S520
└─────────────────────────────────────────────────────────────────┘
                                  │
┌─────────────────────────────────────────────────────────────────┐
│ Sequentially read $2^m$ second subchannel numbers from the basic sequence │
│ starting from an $M^{th}$ subchannel number based on the first subchannel │  S530
│                       number read each time                     │
└─────────────────────────────────────────────────────────────────┘
                                  │
┌─────────────────────────────────────────────────────────────────┐
│ Add $q*N_0$ to each of the $2^m$ second subchannel numbers to obtain $2^m$ third │
│  subchannel numbers, and construct a polar code by using subchannels │  S540
│   corresponding to the $2^m$ third subchannel numbers as information bits │
└─────────────────────────────────────────────────────────────────┘
```

```
┌─────────────────────────────────────────────────────────────────┐
│   Obtain a first sequence and a second sequence based on a basic sequence │  S610
└─────────────────────────────────────────────────────────────────┘
                                  │
┌─────────────────────────────────────────────────────────────────┐
│   Sequentially read fourth subchannel numbers from the basic sequence │  S620
└─────────────────────────────────────────────────────────────────┘
                                  │
┌─────────────────────────────────────────────────────────────────┐
│   Read two fifth subchannel numbers from the first sequence or the second │  S630
│   sequence based on the fourth subchannel numbers read from the basic sequence │
└─────────────────────────────────────────────────────────────────┘
                                  │
┌─────────────────────────────────────────────────────────────────┐
│ Construct a polar code by using the two fifth subchannel numbers read from the │  S640
│      first sequence or the second sequence as information bits    │
└─────────────────────────────────────────────────────────────────┘
```

FIG. 6

METHODS AND APPARATUS FOR POLAR ENCODING

CROSS-REFERENCE TO RELATED APPLICATIONS

This application is a continuation of International Application No. PCT/CN2021/104427, filed on Jul. 5, 2021, which claims priority to Chinese Patent Application No. 202011276780.4, filed on Nov. 16, 2020. The disclosures of the aforementioned applications are hereby incorporated by reference in their entireties.

TECHNICAL FIELD

This application relates to the communication field, and more specifically, to a polar encoding method and apparatus.

BACKGROUND

Three most typical communication scenarios in a 5th generation (5G) communication system include enhanced mobile broadband (eMBB), massive machine type communication (mMTC), and ultra-reliable and low latency communication (URLLC). Requirements of these communication scenarios pose new challenges to existing long term evolution (LTE) technologies. As a most basic radio access technology, channel encoding is one of important research objects to meet a 5G communication requirement.

This application relates to a polar code, and the polar code is a first channel encoding method that can be strictly proved to "reach" a channel capacity. A key problem in construction of the polar code is to determine an information bit sequence number set. Further research shows that the polar code may be constructed by using a sequence. When the polar code is constructed, the information bit set can be determined by reading only a corresponding sequence.

A sequence used by an existing polar code has a length of 1024, but cannot be directly applied to construction of a longer polar code. In addition, optimal construction of the sequence of the polar code is very difficult. To resolve this problem, a feasible practice is to first construct an optimal short sequence (for example, an new radio (NR) sequence with a length of 1K), and then extend the optimal short sequence to a required length. Currently, there is mainly a polarization weight (PW) sequence extension method. However, performance of a sequence extended by using this approximation algorithm is poor. In addition, because the extension method involves floating-point operations, complexity of extension is high.

Aiming at the foregoing problem, this application provides a polar encoding method. A polar code with another code length is constructed based on a short sequence with a length of $N_0$. The method can reduce a length of a polar code that needs to be stored, reduces complexity, and is easy to implement.

SUMMARY

This application provides a polar encoding method and apparatus. A polar code with another code length is constructed based on a short sequence with a length of $N_0$. The method can reduce a length of a polar code that needs to be stored, reduces complexity, and is easy to implement.

According to a first aspect, a polar encoding method is provided. The method includes: obtaining a basic sequence, where the basic sequence includes $N_0$ subchannel numbers; sequentially reading first subchannel numbers from the basic sequence; sequentially reading $2^m$ second subchannel numbers from the basic sequence starting from an $M^{th}$ subchannel number based on the first subchannel number read each time; and adding $q*N_0$ to each of the $2^m$ second subchannel numbers to obtain $2^m$ third subchannel numbers, and constructing a polar code by using $2^m$ subchannels corresponding to the $2^m$ third subchannel numbers as information bits, where a code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, and m is an integer greater than or equal to 1.

It should be understood that, in this embodiment of this application, the subchannel numbers may be read from back to front when the subchannel numbers are read from the basic sequence.

A polar code with another code length is constructed based on the short sequence with the length of $N_0$. The method can reduce a length of a polar code that needs to be stored, reduces complexity, and is easy to implement.

It should be understood that this embodiment of this application may be executed by a terminal device or a network device that provides a network service for a terminal device.

With reference to the first aspect, in some embodiments of the first aspect, M is represented as $t^q$, a value of $t^q$ is obtained by subtracting 1 from a previous value of $t^q$, and an initial value of $t^q$ is $N_0$.

With reference to the first aspect, in some embodiments of the first aspect, q is determined based on the first subchannel numbers read from the basic sequence; and q is represented as $\lfloor T/(N_0/2^m) \rfloor$, where T indicates the first subchannel numbers read from the basic sequence, and $\lfloor \rfloor$ indicates rounding down.

With reference to the first aspect, in some embodiments of the first aspect, the adding $q*N_0$ to each of the $2^m$ second subchannel numbers to obtain $2^m$ third subchannel numbers, and constructing a polar code by using $2^m$ subchannels corresponding to the $2^m$ third subchannel numbers as information bits includes: repeating the operation of reading $2^m$ second subchannel numbers from the basic sequence until a quantity of read subchannel numbers is equal to the information bit length k of the polar code.

With reference to the first aspect, in some embodiments of the first aspect, N is $2^m N_0$.

With reference to the first aspect, in some embodiments of the first aspect, N is a code length of any length, and the method further includes: obtaining a set $\Theta$, where the set $\Theta$ is determined based on the code rate and the information bit length of the polar code; and constructing the polar code based on the $2^m$ third subchannel numbers and the set $\Theta$.

With reference to the first aspect, in some embodiments of the first aspect, the set $\Theta$ includes at least one of the $2^m$ third subchannel numbers, and the constructing the polar code based on the $2^m$ third subchannel numbers and the set $\Theta$ includes: determining whether each of the $2^m$ third subchannel numbers is located in the set $\Theta$; and when one of the $2^m$ third subchannel numbers is located in the set $\Theta$, using a subchannel corresponding to the third subchannel number as a frozen bit; or when one of the $2^m$ third subchannel numbers is not located in the set $\Theta$, using a subchannel corresponding to the third subchannel number as an information bit.

With reference to the first aspect, in some embodiments of the first aspect, when N is $2^m N_0$, the set $\Theta$ is an empty set.

According to a second aspect, an encoding method is provided. The method includes: obtaining a first sequence and a second sequence based on a basic sequence, where the basic sequence, the first sequence, and the second sequence each include $N_0$ subchannel numbers; sequentially reading fourth subchannel numbers from the basic sequence, and reading two fifth subchannel numbers from the first sequence or the second sequence based on the fourth subchannel numbers read from the basic sequence; and constructing a polar code by using the two fifth subchannel numbers read from the first sequence or the second sequence as information bits, where a code length of the polar code is $2N_0$, and an information bit length of the polar code is k.

The polar code with the code length of $2N_0$ is constructed based on a short sequence with a length of $N_0$. The method can reduce a length of a polar code that needs to be stored, reduces complexity, and is easy to implement.

With reference to the second aspect, in some embodiments of the second aspect, the reading two fifth subchannel numbers from the first sequence or the second sequence based on the fourth subchannel numbers read from the basic sequence includes: when T is less than $N_0/2$, reading an $M^{th}$ subchannel number and a $(M-1)M^{th}$ subchannel number from the first sequence; or when T is greater than or equal to $N_0/2$, reading a $P^{th}$ subchannel number and a (P–1)th subchannel number from the second sequence.

With reference to the second aspect, in some embodiments of the second aspect, M is represented as $t^1$, a value of $t^1$ is obtained by subtracting 2 from a previous value of $t^1$, and an initial value of $t^1$ is $N_0$.

With reference to the second aspect, in some embodiments of the second aspect, P is represented as $t^2$, a value of $t^2$ is obtained by subtracting 2 from a previous value of $t^2$, and an initial value of $t^2$ is $N_0$.

With reference to the second aspect, in some embodiments of the second aspect, the constructing a polar code by using the two fifth subchannel numbers read from the first sequence or the second sequence as information bits includes: repeating the operation of reading two fifth subchannel numbers from the first sequence or the second sequence until a quantity of read subchannel numbers is equal to the information bit length k of the polar code.

With reference to the second aspect, in some embodiments of the second aspect, the obtaining a first sequence and a second sequence based on a basic sequence includes: adding $(x-1)N_0$ to each subchannel number in the basic sequence, where 1 and 2 respectively indicate a value of x in the first sequence and a value of x in the second sequence.

According to a third aspect, a polar encoding apparatus is provided. The apparatus includes: an obtaining module, configured to obtain a basic sequence, where the basic sequence includes $N_0$ subchannel numbers; and a processing module, configured to sequentially read first subchannel numbers from the basic sequence. The processing module is further configured to: sequentially read $2^m$ second subchannel numbers from the basic sequence starting from an $M^{th}$ subchannel number based on the first subchannel number read each time; and add $q*N_0$ to each of the $2^m$ second subchannel numbers to obtain $2^m$ third subchannel numbers, and construct a polar code by using $2^m$ subchannels corresponding to the $2^m$ third subchannel numbers as information bits, where a code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, and m is an integer greater than or equal to 1.

A polar code with another code length is constructed based on the short sequence with the length of $N_0$. The method can reduce a length of a polar code that needs to be stored, reduces complexity, and is easy to implement.

With reference to the third aspect, in some embodiments of the third aspect, M is represented as $t^q$, a value of $t^q$ is obtained by subtracting 1 from a previous value of $t^q$, and an initial value of $t^q$ is $N_0$.

With reference to the third aspect, in some embodiments of the third aspect, q is represented as $\lfloor T/(N_0/2^m) \rfloor$, where T indicates the first subchannel numbers read from the basic sequence, and $\lfloor \rfloor$ indicates rounding down.

With reference to the third aspect, in some embodiments of the third aspect, the processing module is specifically configured to repeat the operation of reading the $2^m$ second subchannel numbers from the basic sequence until a quantity of read subchannel numbers is equal to the information bit length k of the polar code.

With reference to the third aspect, in some embodiments of the third aspect, N is $2^m N_0$.

With reference to the third aspect, in some embodiments of the third aspect, N is a code length of any length; the obtaining module is further configured to obtain a set $\Theta$, where the set $\phi$ is determined based on the code rate and the information bit length of the polar code; and the processing module is further configured to construct the polar code based on the $2^m$ third subchannel numbers and the set $\Theta$.

With reference to the third aspect, in some embodiments of the third aspect, the set $\Theta$ includes at least one of the $2^m$ third subchannel numbers, and the processing module is specifically configured to: determine whether each of the $2^m$ third subchannel numbers is located in the set $\Theta$; and when one of the $2^m$ third subchannel numbers is located in the set $\Theta$, use a subchannel corresponding to the third subchannel number as a frozen bit; or when one of the $2^m$ third subchannel numbers is not located in the set $\Theta$, use a subchannel corresponding to the third subchannel number as an information bit.

With reference to the third aspect, in some embodiments of the third aspect, when N is $2^m N_0$, the set $\Theta$ is an empty set.

According to a fourth aspect, a polar encoding apparatus is provided. The apparatus includes: a second obtaining module, configured to obtain a first sequence and a second sequence based on a basic sequence, where the basic sequence, the first sequence, and the second sequence each include $N_0$ subchannel numbers; and a second processing module, configured to sequentially read fourth subchannel numbers from the basic sequence. The processing module is further configured to: read two fifth subchannel numbers from the first sequence or the second sequence based on the fourth subchannel numbers read from the basic sequence; and construct a polar code by using the two fifth subchannel numbers read from the first sequence or the second sequence as information bits, where a code length of the polar code is $2N_0$, and an information bit length of the polar code is k.

The polar code with the code length of $2N_0$ is constructed based on a short sequence with a length of $N_0$. The method can reduce a length of a polar code that needs to be stored, reduces complexity, and is easy to implement.

With reference to the fourth aspect, in some embodiments of the fourth aspect, the second processing module is specifically configured to: when T is less than $N_0/2$, read an $M^m$ subchannel number and a $(M-1)^{th}$ subchannel number from the first sequence; or when T is greater than or equal to $N_0/2$, read a $P^{th}$ subchannel number and a $(P-1)^{th}$ subchannel number from the second sequence.

With reference to the fourth aspect, in some embodiments of the fourth aspect, M is represented as $t^1$, a value of $t^1$ is obtained by subtracting 2 from a previous value of $t^1$, and an initial value of $t^1$ is $N_0$.

With reference to the fourth aspect, in some embodiments of the fourth aspect, P is represented as $t^2$, a value of $t^2$ is obtained by subtracting 2 from a previous value of $t^2$, and an initial value of $t^2$ is $N_0$.

With reference to the fourth aspect, in some embodiments of the fourth aspect, the second processing module is specifically configured to repeat the operation of reading the two fifth subchannel numbers from the first sequence or the second sequence until a quantity of read subchannel numbers is equal to the information bit length of the polar code.

With reference to the fourth aspect, in some embodiments of the fourth aspect, the second obtaining module is specifically configured to add $(x-1)N_0$ to each subchannel number in the basic sequence, where 1 and 2 respectively indicate a value of x in the first sequence and a value of x in the second sequence.

According to a fifth aspect, a polar encoding apparatus is provided. The apparatus has functions of implementing the methods according to the foregoing aspects. The function may be implemented by hardware, or may be implemented by executing corresponding software by hardware. The hardware or the software includes one or more modules corresponding to the foregoing function.

According to a sixth aspect, a polar encoding apparatus is provided, including a processor. The processor is configured to be coupled to a memory, and is configured to invoke a computer program from the memory and run the computer program, to perform the method according to any one of the foregoing aspects or the possible embodiments of the foregoing aspects.

According to a seventh aspect, a polar encoding apparatus is provided, including a processor and a memory. The memory is configured to store a computer program, and the processor is configured to invoke the computer program from the memory and run the computer program, so that the communication device performs the method according to any one of the foregoing aspects or the possible embodiments of the aspects.

According to an eighth aspect, a polar encoding apparatus (for example, the apparatus may be a chip system) is provided. The apparatus includes a processor, configured to support the communication apparatus in implementing functions in the foregoing aspects. In a possible design, the apparatus further includes a memory. The memory is configured to store program instructions and data that are necessary for the communication apparatus. When the apparatus is the chip system, the apparatus may include a chip, or may include a chip and another discrete device.

According to a ninth aspect, a computer-readable storage medium is provided, and is configured to store a computer program. The computer program includes instructions used to perform the method according to any one of the foregoing aspects or the possible embodiments of the foregoing aspects.

According to a tenth aspect, a computer program product is provided, including a computer program. When the computer program product runs on a computer device, the computer device is enabled to perform the methods according to the foregoing aspects.

According to an eleventh aspect, a chip is provided. The chip includes a logic circuit and an input/output interface. The input/output interface is configured to receive code instructions or information. For example, the input interface inputs the basic sequence in the foregoing aspects, the output interface outputs a polar code encoded by performing the methods in the foregoing aspects, and the logic circuit is configured to, by executing the code instructions or based on the information, perform the methods according to the foregoing aspects. These or other aspects of this application are clearer and more comprehensible in descriptions of the following embodiments.

BRIEF DESCRIPTION OF DRAWINGS

FIG. 5 is a schematic diagram of a polar encoding method according to an embodiment of this application;

FIG. 6 is a schematic diagram of another polar encoding method according to an embodiment of this application;

DESCRIPTION OF EMBODIMENTS

Figure 1:
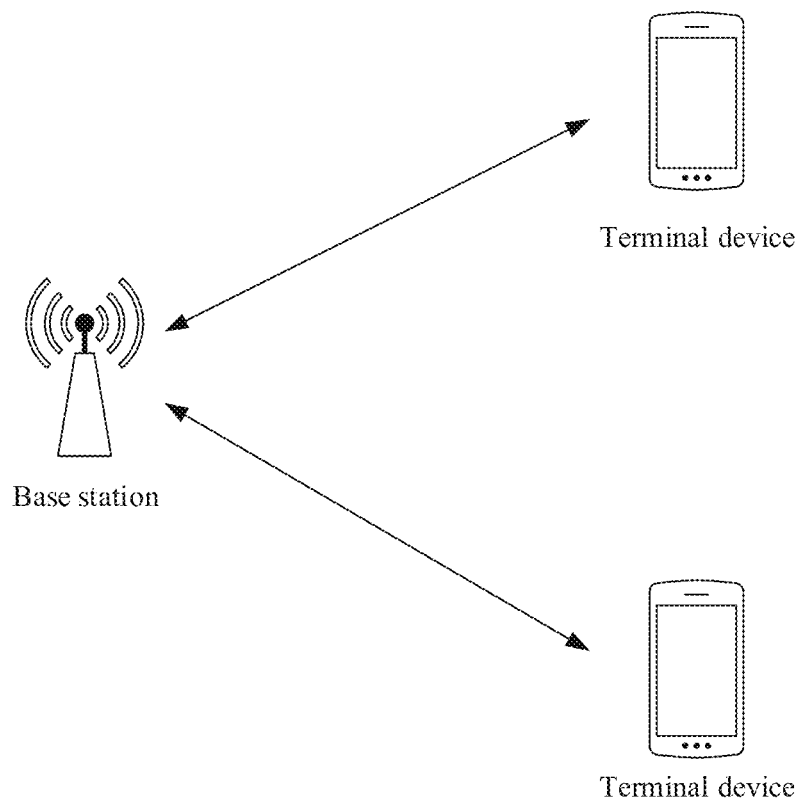
FIG. 1 is a schematic diagram of an application scenario according to an embodiment of this application.

The following describes technical solutions of this application with reference to accompanying drawings.

The technical solutions in embodiments of this application may be applied to various communication systems, such as a global system for mobile communications (GSM), a code division multiple access (CDMA) system, a wideband code division multiple access (WCDMA) system, a general packet radio service (GPRS) system, a long term evolution (LTE) system, an LTE frequency division duplex (FDD) system, an LTE time division duplex (TDD) system, a universal mobile telecommunications system (UMTS), a worldwide interoperability for microwave access (WiMAX) communication system, a 5th generation (5G) system or a new radio (NR) system, and a future evolved communication system.

In embodiments of this application, a terminal device may be a device having a wireless transceiver function, and may be deployed on land, including an indoor device or an outdoor device, a handheld device, a wearable device, or a vehicle-mounted device, may be deployed on water (for example, on a ship), or may be deployed in the air (for example, on an airplane, a balloon, or a satellite). The terminal device may communicate with a core network through a radio access network (RAN), and exchange voice and/or data with the RAN. The terminal device may be a mobile phone, a tablet computer, a computer having a wireless transceiver function, a mobile internet device (MID), a wearable device, a virtual reality (VR) terminal device, an augmented reality (AR) terminal device, a wireless terminal in industrial control, a wireless terminal in self driving, a wireless terminal in telemedicine (remote medical), a wireless terminal in a smart grid, a wireless terminal in transportation safety, a wireless terminal in a smart city, a wireless terminal in a smart home, or the like. An application scenario is not limited in embodiments of this application. Sometimes, the terminal device may also be referred to as user equipment (UE), a mobile station, a remote station, or the like. A specific technology, a device form, and a name used by the terminal device are not limited in embodiments of this application.

A network device in embodiments of this application may include an evolved NodeB (NodeB or eNB or e-NodeB) in a long term evolution (LTE) system or an evolved LTE system (LTE-advanced, LTE-A), for example, a conventional macro base station eNB and a micro base station eNB in a heterogeneous network scenario, or may include a next generation NodeB (gNB) in a 5th generation (5G) new radio (NR) system, or may further include a radio network controller (RNC), a NodeB (NB), a base station controller (BSC), a base transceiver station (BTS), a transmission reception point (TRP), a home base station (for example, a home evolved NodeB, or a home NodeB, HNB), a baseband unit (BBU), a baseband unit pool BBU pool, or a Wi-Fi access point (AP), or may further include a centralized unit (CU) and a distributed unit (DU) in a cloud radio access network (Cloud RAN) system. This is not limited in embodiments of this application. In a split deployment scenario in which an access network device includes the CU and the DU, the CU supports protocols such as a radio resource control (RRC) protocol, a packet data convergence protocol (PDCP), and a service data adaptation protocol (SDAP), and the DU mainly supports a radio link control (RLC) layer protocol, a media access control (MAC) layer protocol, and a physical layer protocol.

FIG. 1 is a schematic diagram of a scenario according to this application. A base station and terminal devices are included, where the base station provides a communication service for the terminal device. The base station transmits downlink data to the terminal, where the data is encoded by using channel encoding, and channel-encoded data is transmitted to the terminal after constellation modulation. The terminal device transmits uplink data to the base station, where the uplink data may also be encoded by using channel encoding, and encoded data is transmitted to the base station after constellation modulation. The application scenario of this application may be applied to communication between the base station and the terminal device in a 60 GHz frequency band.

Rapid evolution of wireless communication indicates that a 5G communication system will present some new features. Three most typical communication scenarios in the 5G communication system are as follows.

(1) eMBB scenario: higher transmission rates (peak rates: 10 Gbit/s in an uplink and 20 Gbit/s in a downlink) and higher spectral efficiencies (peak spectral efficiencies: 12 bit/(s·Hz) in the uplink and 30 bit/(s·Hz) in the downlink) are required.

(2) mMTC scenario: higher connection density ($1\times10^6$ connections/$km^2$) and lower power consumption (a battery life of a terminal reaches 15 years) are required.

(3) URLLC scenario: lower latency (an uplink and downlink latency is 0.5 ms, that is, an end-to-end latency is less than 1 ms), higher reliability (99.9999%, that is, the frame error rate within 1 ms is less than $10^{-6}$), and lower error floor are required. Requirements of these communication scenarios pose new challenges to existing LTE technologies.

Figure 2:
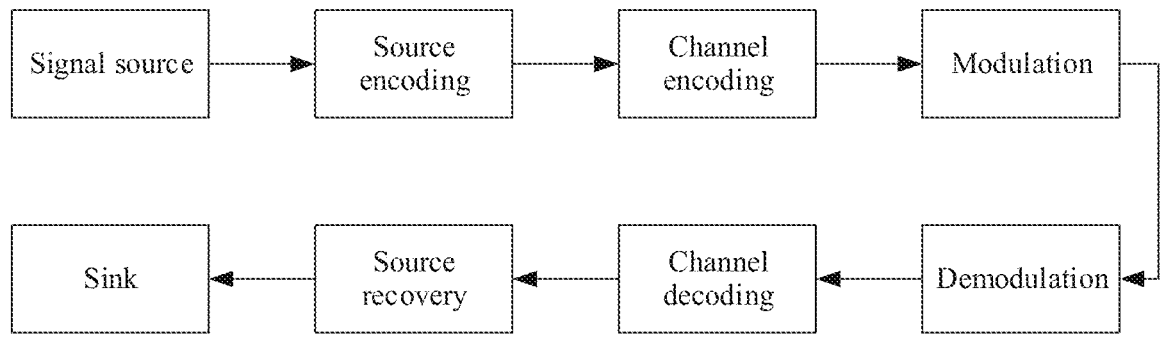
FIG. 2 is a schematic diagram of a structure of a communication process in a communication system.

As a most basic radio access technology, channel encoding is one of important research objects that meet a 5G communication requirement. FIG. 2 is a schematic diagram of a structure of a communication process in a communication system, including channel encoding and channel decoding.

After the Shannon theory is proposed, scholars from various countries have been devoted to finding an encoding/decoding method that can reach the Shannon limit and has low complexity. Although a turbo code and a re-proposed low-density parity-check code (LDPC) that have become mainstream research directions have been well applied in LTE and world interoperability for microwave access (WiMAX), the two codes cannot well resolve some important problems in 5G communication.

In the future, channel encoding needs to be able to support a larger range of bit rates with lower complexity and better performance. In addition, an important feature that distinguishes eMBB and mMTC from LTE is medium- and short-packet transmission. Therefore, channel encoding is required to better support communication of this type of code length. Control channels with short packets and low bit rates also benefit. URLLC further imposes a stricter requirement on reliability of data transmission. Currently, LTE turbo cannot support an excessively low or excessively high bit rate. For transmission of a medium- and short-packet, it is difficult for the turbo code and the LDPC code to achieve ideal performance in a limited code length due to encoding/decoding features of the turbo code and the LDPC code. For a long packet, although the turbo code and the LDPC code can approach the Shannon limit as the code length increases, theoretical performance cannot be achieved. In addition, during embodiment, the turbo code and the LDPC code have high complexity in an encoding/decoding embodiment process. Therefore, in the 5G communication system, a new encoding technology is urgently required to resolve problems in short packet, bit rate, reliability, and complexity in the existing technology.

In 2009, Professor Arikan proposed an encoding scheme based on channel polarization, which is referred to as a polar code. The polar code is a first channel encoding method that can be strictly proved to "achieve" a channel capacity. In a case of different code lengths, particularly for a limited code, performance of the polar code is far better than performance of the turbo code and performance of the LDPC code. In addition, the polar code has lower computational complexity in encoding/decoding. These advantages enable the polar code to be widely used in 5G.

The polar code is a linear block code, a generator matrix is $G_N$, and an encoding process is $X_1^N = u_1^N G_N$. $u_1^N = (u_1, u_2, \ldots, u_N)$ is a binary row vector with a length of N (namely, a code length). $G_N$ is an N×N matrix, and $G_N = F_2^{\otimes n}$, where $$F_2 = \begin{bmatrix} 1 & 0 \\ 1 & 1 \end{bmatrix},$$

n=log 2(N), and $F_2^{\otimes n}$ is defined as a Kronecker product of n matrices $F_2$.

In the encoding process of the polar code, some bits in $u_1^N$ are used to carry information and are referred to as information bits, and a set of indexes of these bits is denoted as $\mathcal{A}$. Other bits are set to fixed values pre-agreed on by a transmit end and a receive end, and are referred to as fixed bits. A set of indexes of these bits is represented by a complementary set $\mathcal{A}^c$ of $\mathcal{A}$.

Figure 3:
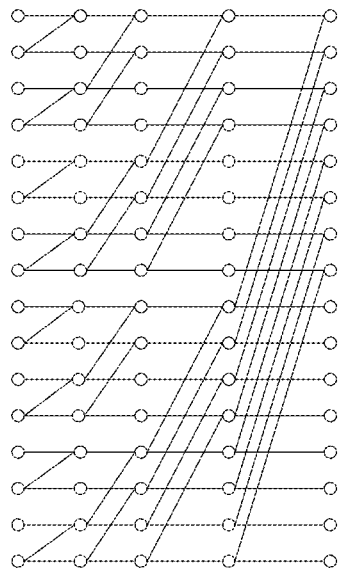
FIG. 3 is a schematic diagram of an encoding process of a polar code.

FIG. 3 is a schematic diagram of the encoding process of the polar code. As shown in FIG. 3, the encoding process of the polar code may be represented by using a trellis diagram. $u_1^N$ is placed at a leftmost side of the trellis diagram, and n-order butterfly operations are sequentially performed from left to right, to obtain an encoding result $X_1^N$.

A key problem in construction of the polar code is to determine an information bit sequence number set $\mathcal{A}$. In an early theoretical research phase, the set $\mathcal{A}$ is usually selected according to the following method: First, a polar channel error probability $P_e^{(i)}$ corresponding to a bit with a sequence number i is obtained by using a method such as density evolution or Gaussian approximation, and K sequence numbers with minimum values of $P_e^{(i)}$ are selected to form the set $\mathcal{A}$. In this method, respective $P_e^{(i)}$ needs to be calculated for different channel conditions. In other words, it is a channel-dependent method. Because channels are variable in an actual scenario, the method is difficult to implement in an actual application.

Further research shows that the polar code may be constructed by using a sequence. When the polar code is constructed, the information bit set $\mathcal{A}$ can be determined by reading only a corresponding sequence. Specifically, the sequence may use polar channel sequence numbers to indicate a sequence of selecting information bits. For example, when a code length is 8, the sequence of selecting the information bits is [1, 2, 3, 5, 4, 6, 7, 8]. When an information bit set $\mathcal{A}$ with an information length (e.g., quantity) of k is constructed, only k subchannels need to be read from back to front as the information bit set $\mathcal{A}$. For example, when k=2, A=[7, 8] is read from back to front from the foregoing sequence; or when k=4, A=[4, 6, 7, 8]. This sequence storage manner is easier to implement, and this form is also used in 5G standards.

Currently, the polar code is selected as a channel coding scheme of a control channel in 5G, and a currently used sequence has a length of 1024. When channel encoding with a length greater than 1024 is performed on the polar code, construction of a long sequence has the following two challenges.

First, the used sequence has the length of 1024, and cannot be directly applied to construction of a longer polar code.

Second, optimal construction of the sequence of the polar code is very difficult. This is mainly because it is difficult to analyze a successive cancellation list (SCL) decoder. Existing research shows that a polar code constructed by Gaussian approximation is not optimal in the SCL decoder, but the optimal construction is not provided. Currently, short sequences are mainly constructed by an artificial intelligence (AI)+search+large-scale simulation verification method. However, it is very difficult to construct long sequences by using this method because a search space exponent increases.

To resolve this problem, a feasible practice is to first construct an optimal short sequence (for example, an NR sequence with a length of 1K), and then extend the optimal short sequence to a required length.

Figure 4:
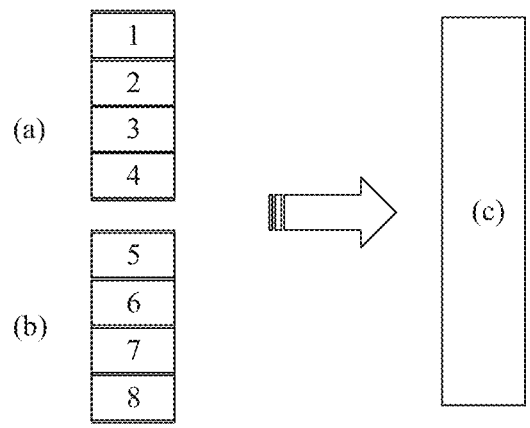
FIG. 4 is a schematic diagram of sequence extension.

For ease of understanding, a schematic diagram shown in FIG. 4 may be used for representation. A sequence of a polar code may be represented by using a queue (first-in first-out). Blocks (indicating subchannel numbers or bits) are placed into the queue from top to bottom, and then are sequentially read from bottom to top. As shown in FIG. 4, a basic sequence to be extended may be represented by a sequence (a) with a length of N. A sequence (b) with a length of N may be obtained by adding N to each element in the basic sequence. The sequence (a) and the sequence (b) respectively correspond to a first half and a second half of subchannels of a polar code with a length of 2N.

As shown in FIG. 4, sequence extension may be considered as sequentially moving elements (namely, numbers 1 to 8 in the figure) in the two sequences: the sequence (a) and the sequence (b) to a sequence (c) on the right, where the sequence (c) is an extended sequence with a length of 2N. When it is determined to move an element from the sequence (a) or the sequence (b), the element at the bottom of the sequence (a) or the sequence (b) is moved to the sequence (c). In a process of moving the element, or in a process of extending the sequence, a key problem is to determine a sequence in which the element is moved from the sequence (a) or the sequence (b) to the sequence (c).

To implement the preceding extension method, a common extension manner is as follows:

polarization weight (PW) sequence extension. When a sequence with a length of N is extended according to this method, a PW sequence with a length of 2N is directly constructed first. Specifically, when a 2N-length sequence with a length of k information bits is constructed, an information bit set is first constructed based on the PW sequence with the length of 2N, then quantities of information bits obtained from a red queue and a blue queue are determined based on the information bit set, and then corresponding information bits are read from bottom to top.

However, performance of a sequence extended by using this approximation algorithm is poor, and because floating-point operations are involved, complexity of extension is high.

This application provides a polar encoding method. A polar code with another code length is constructed based on a short sequence with a length of $N_0$. The method can reduce a length of a polar code that needs to be stored, reduces complexity, and is easy to implement.

This application is applicable to the following application scenarios: supporting a low-power service, supporting a high-throughput service, and supporting a delay-sensitive service.

It should be understood that the short sequence in embodiments of this application may be obtained through a large number of efforts in search, simulation, and design, and includes abundant feature information for constructing information bits of a polar code, especially feature construction applicable to an SCL decoder. Alternatively, the short sequence in this application may be obtained in another manner. This is not limited in this application.

The encoding method in embodiments of this application may be applied to a communication process between various communication devices. The communication device may be a terminal device, a network device that provides a network service for a terminal device, or the like. This is not limited in this application.

It should be understood that an extended sequence used in the encoding process in embodiments of this application may be extended in the encoding process, that is, performed online, or may be performed offline.

FIG. 5 is a schematic diagram of a polar encoding method according to an embodiment of this application. As shown in FIG. 5, the method includes operations S510 to S540. The following describes these operations in detail.

S510: Obtain a basic sequence, where the basic sequence includes $N_0$ subchannel numbers.

In some embodiments, the encoding method may be applied to a polar code.

It should be understood that, that the basic sequence includes $N_0$ subchannel numbers may be understood as that a length of the basic sequence is $N_0$.

S520: Sequentially read first subchannel numbers from the basic sequence.

In some embodiments, in this embodiment of this application, a manner of reading the subchannel numbers from the basic sequence may be sequentially reading from back to front.

It should be understood that sequentially reading the first subchannel numbers from the basic sequence may be understood as reading one subchannel number from the basic sequence each time, or may be expressed in a form of a formula. For example, a $j^{th}$ subchannel number is read from the basic sequence, where an initial value of j is $N_0$, and $j=j-1$, which indicates that a sequence of the $j^{th}$ subchannel number read this time is obtained by subtracting 1 from a sequence of a subchannel number read last time.

S530: Sequentially read $2^m$ second subchannel numbers from the basic sequence starting from an $M^{th}$ subchannel number based on the first subchannel number read each time.

In an embodiment, M is represented as $t^q$, a value of $t^q$ is obtained by subtracting 1 from a previous value of $t^q$, and an initial value of $t^q$ is $N_0$.

Compared with prior approaches, in this embodiment of this application, the $2^m$ subchannel numbers are read from the basic sequence at a time, so that the existing technology can be reused to a maximum extent, a length of a polar code that needs to be stored is reduced, complexity is reduced, and embodiment is easy.

S540: Add $q*N_0$ to each of the $2^m$ second subchannel numbers to obtain $2^m$ third subchannel numbers, and construct a polar code by using $2^m$ subchannels corresponding to the $2^m$ third subchannel numbers as information bits.

In an embodiment, a code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, and m is an integer greater than or equal to 1.

In an embodiment, q is determined based on the first subchannel numbers read from the basic sequence; and q is represented as $\lfloor T/(N_0/2^m) \rfloor$, where T indicates the first subchannel numbers read from the basic sequence, and $\lfloor \rfloor$ indicates rounding down.

In an embodiment, the adding $q*N_0$ to each of the $2^m$ second subchannel numbers to obtain $2^m$ third subchannel numbers, and constructing a polar code by using $2^m$ subchannels corresponding to the $2^m$ third subchannel numbers as information bits includes: repeating the operation of reading $2^m$ second subchannel numbers from the basic sequence until a quantity of read subchannel numbers is equal to the information bit length k of the polar code.

In some embodiments, the method may be applied to construction of a polar code with a code length of $2^mN_0$ by using the sequence with the length of $N_0$, or may be applied to construction of a polar code with a code length of any length.

In an embodiment, N is $2^mN_0$.

In this case, the method may be used to construct the polar code with the length of $2^mN_0$.

In another embodiment, N is a code length of any length, and the method further includes: obtaining a set $\Theta$, where the set is determined based on the code rate and the information bit length of the polar code; and constructing the polar code based on the $2^m$ third subchannel numbers and the set $\Theta$.

On the basis of the operation of obtaining the polar code with the length of $2^mN_0$, an operation of determining the read subchannel number by using the set $\Theta$ is added, so that code rates of different polar codes can be considered, and then a polar code with a code length of any length can be constructed. In an embodiment, the set $\Theta$ includes at least one of the $2^m$ third subchannel numbers, and the constructing the polar code based on the $2^m$ third subchannel numbers and the set $\Theta$ includes: determining whether each of the $2^m$ third subchannel numbers is located in the set $\Theta$; and when one of the $2^m$ third subchannel numbers is located in the set $\Theta$, using a subchannel corresponding to the third subchannel number as a frozen bit; or when one of the $2^m$ third subchannel numbers is not located in the set $\Theta$, using a subchannel corresponding to the third subchannel number as an information bit.

It should be understood that the set $\Theta$ may include at least one of $2^m$ subchannel numbers obtained after $q*N_0$ is added to $2^m$ subchannel numbers that are read a plurality of times in the foregoing operation, that is, the set $\Theta$ may include at least one of the $2^m$ subchannel numbers obtained after $q*N_0$ is added to the $2^m$ subchannel numbers that are read for the first time, or may include at least one of $2^m$ subchannel numbers obtained after $q*N_0$ is added to $2^m$ subchannel numbers that are read subsequently.

It should be understood that the foregoing method in which the read subchannel number is determined by using the set $\Theta$ to construct the polar code with the code length of any length may also be applicable to construction of the polar code with the length of $2^mN_0$. In this case, the set $\Theta$ is an empty set. Specifically, when N is $2^mN_0$, the set $\Theta$ is an empty set.

In this embodiment of this application, the polar code with another code length is constructed based on the short sequence with the length of $N_0$. The method can reduce the length of the polar code that needs to be stored, reduces complexity, and is easy to implement.

FIG. 6 is a schematic diagram of another polar encoding method according to an embodiment of this application. As shown in FIG. 6, the method 600 includes operations S610 to S640. The following describes these operations in detail.

S610: Obtain a first sequence and a second sequence based on a basic sequence.

In an embodiment, the basic sequence, the first sequence, and the second sequence each include $N_0$ subchannel numbers.

It should be understood that the foregoing sequences each include $N_0$ subchannel numbers, or it may be understood that a length of each of the foregoing sequences is $N_0$.

In an embodiment, the obtaining a first sequence and a second sequence based on a basic sequence includes: adding $(x-1)N_0$ to each subchannel number in the basic sequence, where 1 and 2 respectively indicate a value of x in the first sequence and a value of x in the second sequence.

S620: Sequentially read fourth subchannel numbers from the basic sequence.

It should be understood that sequentially reading the fourth subchannel numbers from the basic sequence may be understood as reading one subchannel number from the basic sequence each time, or may be represented as reading a $j^{th}$ subchannel number from the basic sequence, where an initial value of j is $N_0$, and j=j−1, which indicates that a sequence of the subchannel number read from the basic sequence this time is obtained by subtracting 1 from a sequence of a subchannel number read last time.

S630: Read two fifth subchannel numbers from the first sequence or the second sequence based on the fourth subchannel numbers read from the basic sequence.

In an embodiment, the reading two fifth subchannel numbers from the first sequence or the second sequence based on the fourth subchannel numbers read from the basic sequence includes: when T is less than $N_0/2$, reading an $M^{th}$ subchannel number and a $(M-1)^{th}$ subchannel number from the first sequence; or when T is greater than or equal to $N_0/2$, reading a $P^{th}$ subchannel number and a $(P-1)^{th}$ subchannel number from the second sequence.

In an embodiment, M is represented as $t^1$, a value of $t^1$ is obtained by subtracting 2 from a previous value of $t^1$, and an initial value of $t^1$ is $N_0$.

In an embodiment, P is represented as $t^2$, a value of $t^2$ is obtained by subtracting 2 from a previous value of $t^2$, and an initial value of $t^2$ is $N_0$.

Compared with prior approaches, in this embodiment of this application, the two subchannel numbers are read from the basic sequence at a time, so that the existing technology can be reused to a maximum extent, a length of a polar code that needs to be stored is reduced, complexity is reduced, and embodiment is easy.

S640: Construct a polar code by using the two fifth subchannel numbers read from the first sequence or the second sequence as information bits.

In an embodiment, a code length of the polar code is $2N_0$, and an information bit length of the polar code is k.

It should be understood that, after the operation of reading the subchannel numbers from the first sequence or the second sequence is performed once in the foregoing process, a quantity of obtained subchannel numbers may not be equivalent to an information bit length k of an encoded polar code. Therefore, the foregoing reading operation needs to be performed once or a plurality of times, so that a quantity of read subchannel numbers is the same as the information bit length k of the polar code, to construct the polar code.

In an embodiment, the constructing a polar code by using the two fifth subchannel numbers read from the first sequence or the second sequence as information bits includes: repeating the operation of reading two fifth subchannel numbers from the first sequence or the second sequence until the quantity of read subchannel numbers is equal to the information bit length k of the polar code.

In this embodiment of this application, the polar code with the length of $2N_0$ is constructed based on the short sequence with the length of $N_0$. This method can reduce the length of the polar code that needs to be stored, reduces complexity, and is easy to implement.

The following provides an encoding method for a polar code in an embodiment of this application. In the encoding method in this embodiment of this application, a polar code with a code length of $2^m N_0$ may be constructed by using a short sequence with a length is $N_0$. A code rate of the polar code is k/N, k is an information bit length of the polar code, and m may be a natural number greater than or equal to 1.

The following describes in detail the encoding method for the polar code.

(1) Obtain a basic sequence, where the basic sequence has a length of $N_0$, or includes $N_0$ subchannel numbers.

(2) Initialize a set QI as an empty set [ ] for storing subchannel numbers indicating information bits.

(3) When the polar code whose code length is $2^m N_0$ and information bit length is k is constructed, initial values of j and $t^q$ are both $N_0$, and the following process is repeated until subchannels of k information bits are found.

(a) Read a $j^{th}$ element from the basic sequence, where the $j^{th}$ element is denoted as T, and j=j−1.

(b) Calculate q based on T, where $q=\lfloor T/(N/2^m)\rfloor$, further read, from the basic sequence, $2^m$ subchannel numbers from back to front starting from $t^q$ at a time, and add $q*N_0$ to each of the read $2^m$ subchannel numbers, where $t^q=t^q-2^m$.

(c) Put $2^m$ subchannel numbers to which $q*N_0$ is added into the set QI.

(4) Repeat the process in (3) until the set QI includes the subchannels of k information bits.

The description in the foregoing embodiment is a method in which the $2^m$ subchannel numbers are read from the basic sequence at a time based on the basic sequence, and then corresponding subchannel numbers are obtained from the $2^m$ subchannel numbers. Alternatively, to obtain the foregoing polar code, another manner may be used. For details, refer to the following description.

(1) Denote an initial sequence as $Q^0$, where a length of the initial sequence is $N_0$, add $(X-1)N_0$ to each element (namely, different subchannel numbers) in $Q^0$, denote an obtained sequence as $Q^X$, where X may be 1, 2, 3, 4, ..., $2^m$, so that $2^m$ sequences: a first sequence $Q^1$, a second sequence $Q^2$, a third sequence $Q^3$, ..., and a $Q^X$ sequence whose lengths are $N_0$ may be obtained.

(2) Initialize a set QI as an empty set [ ] for storing subchannel numbers indicating information bits.

(3) When the polar code whose code length is $2^m N_0$ and information bit length is k is constructed, initial values of j, $t^1$, $t^2$, ..., and $t^{2^m}$ are all $N_0$, and the following process is repeated until subchannels of k information bits are found.

(a) Read a $j^{th}$ element from the sequence $Q^0$, where the $j^{th}$ element is denoted as T, and j=j−1.

(b) Calculate q based on T, where $q=\lfloor T/(N/2^m)\rfloor$, and further read, from a sequence $Q^{q+1}$, $2^m$ subchannel numbers from back to front starting from $t^{q+1}$ at a time, where $t^{q+1}=t^{q+1}-2^m$.

(c) Put the read $2^m$ subchannel numbers into the set QI.

(4) Repeat the process in (3) until the set QI includes the subchannels of k information bits.

In some embodiments, an embodiment of a process of the foregoing second manner may also be represented by using the following pseudocode:

```
QI =[ ], Q^{j+1} = Q^0+j *N_0, t^{j+1}=N_0
for j = 0:( 2^m −1)
  for i = N_0 to 1
    q = ⌊"Seq(i)/(N_0/2^m " )⌋
    for jj = 1: 2^m
    QI = [QI, Q^{q+1} (t^{q+1})]
      t^{q+1} = t^{q+1}−1
      if length(QI)== k: break end
    end
    if length(QI)==k
      break
    end
end
```

Different from the description in the foregoing manner, in the method, the $2^m$ sequences whose lengths are $N_0$ are obtained by using a basic sequence, and the polar code is constructed by using the basic sequence and the $2^m$ sequences whose lengths are $N_0$. It should be understood that both the foregoing two methods may be used to construct polar codes with different code lengths.

In this embodiment of this application, the polar code with the length of $2^m$ is constructed by using the short sequence with the length of $N_0$. In this way, a sequence that needs to be stored can be further reduced, a process of constructing a long polar code can be simplified, and complexity is reduced. In addition, the polar code construction method in this embodiment of this application can reuse an existing technology to a maximum extent, and is easy to implement.

For the scenario in which the polar code with the code length of $2^m N_0$ is constructed by using the sequence with the length of $N_0$ in the foregoing embodiment, when m is 1, the encoding method for the polar code may alternatively be represented in another manner. The following describes a process of constructing a polar code with a length of $2N_0$ by using a sequence with a length of $N_0$ in this application.

(1) Denote an initial sequence as $Q^0$, and copy the initial sequence $Q^0$ to obtain a first sequence $Q^1$;
add $N_0$ to each subchannel number in the first sequence $Q^1$, to obtain a second sequence $Q^2$ with a length of $N_0$;
initialize a set QI as an empty set for storing subchannel numbers indicating information bits; and
enable initial values of j, and $t^2$ to be $N_0$, where j, $t^1$, and $t^2$ respectively indicate subchannel numbers read from the basic sequence $Q^0$, the first sequence $Q^1$, and the second sequence $Q^2$.

(2) When a polar code with a code length of $2N_0$ and an information bit length of k is constructed, the following process is repeatedly performed until subchannel numbers of k information bits are found.

(a) Read kith subchannel number from the basic sequence $Q^0$, where the $j^{th}$ subchannel number is denoted as T, and j=j−1; and
if $T<N_0/2$, read a $(t^1)^{th}$ subchannel number and a $(t^1-1)^{th}$ subchannel number from the first sequence $Q^1$ at a time, where $t^1=t^1-2$; or
if $T \geq N_0/2$, read a $(t^2)^{th}$ subchannel number and a $(t^2-1)^{th}$ subchannel number from the second sequence $Q^2$ at a time, where $t^2=t^2-2$.

(b) Add the two read subchannel numbers to the information bit set QI.

In some embodiments, the foregoing process may be further represented by using the following pseudocode:

```
QI =[ ], Q⁰ =,Q¹= Q⁰·Q²= Q⁰+ N₀, t¹= N₀, t²=N₀, j= N₀
for j = N₀ to 1
    if Seq(j)<N₀/2:
            for jj = 1:2
            QI = [QI, Q¹ (t¹)]
            t¹ = t¹−1
            if length(QI)==k: break end
            end
    else
            for jj = 1:2
                QI = [QI, Q² (t²)]
            t²=   t²−1
            if length(QI)==k: break end
            end
    end
    if length(QI)==k
        break
    end
end
```

In this embodiment of this application, the polar code with the length of $2N_0$ is constructed by using the short sequence with the length of $N_0$. In this way, a sequence that needs to be stored can be further reduced, a process of constructing a long polar code can be simplified, and complexity is reduced. In addition, the polar code construction method in this embodiment of this application can reuse an existing technology to a maximum extent, and is easy to implement.

The following provides another encoding method for a polar code in an embodiment of this application. A polar code with any code length, including a length of $2^m N_0$, is constructed by using a short sequence with a length of $N_0$. The following describes in detail operations in this embodiment of this application.

(1) Design rate matching of a long code in advance, and pre-generate a location (represented by $\Theta$) of shortening or puncturing; or, determine a predefined frozen bit set $\Theta$ based on a code rate (k/N) and an information bit length k of a polar code to be obtained. The frozen bit set $\Theta$ includes one or more subchannel numbers, or the frozen bit set $\Theta$ may be an empty set. It should be understood that the symbol $\Theta$ herein is merely a representation manner, and the set may also be represented by using another symbol or form. This is not limited in this embodiment of this application.

(2) Construct the polar code according to the method for generating the polar code with the code length of $2^m N_0$ in the foregoing embodiment.

1. Denote an initial sequence as $Q^0$, where a length of the initial sequence is $N_0$, add $(X-1)N_0$ to each element (namely, different subchannel numbers) in $Q^0$, denote an obtained sequence as $Q^X$, where X may be 1, 2, 3, 4, ..., $2^m$, so that $2^m$ sequences: a first sequence $Q^1$, a second sequence $Q^2$, a third sequence $Q^3$, ..., and a $Q^X$ sequence whose lengths are $N_0$ may be obtained.

2. Initialize a set QI as an empty set [ ] for storing subchannel numbers indicating information bits.

3. When the polar code whose code length is $2^m N_0$ and information bit length is k is constructed, initial values of j, $t^1$, $t^2$, ..., and $t^{2^m}$ are all $N_0$, and the following process is repeated until subchannels of k information bits are found.

(a) Read a $j^{th}$ element from the sequence $Q^0$, where the $j^{th}$ element is denoted as T, and j=j−1.

(b) Calculate q based on T, where $q=\lfloor T/(N/2^m) \rfloor$, and further read, from a sequence $Q^{q+1}$, $2^m$ subchannel numbers from back to front starting from $t^{q+1}$ at a time, where $t^{q+1}=t^{q+1}-2^m$.

(c) Put the read $2^m$ subchannel numbers into the set QI.

4. Repeat the process in 3 until the set QI includes the subchannels of k information bits.

5. Construct the polar code based on the foregoing information bit set $\Theta$ and the subchannels of the k information bits read in the foregoing operation. Specifically, the subchannels of the k information bits read in the foregoing operation are determined one by one based on the foregoing set $\Theta$, to determine whether the subchannels of the k information bits are located in the foregoing set $\Theta$. When one of the subchannels of the k information bits is located in the foregoing set $\Theta$, a corresponding subchannel number is used as a frozen bit. Alternatively, when one of the subchannels of the k information bits is not located in the foregoing set $\Theta$, a subchannel number corresponding to the subchannel is still used as a subchannel of an information bit to send information.

In some embodiments, the foregoing process may be represented by using the following pseudocode.

First, a frozen bit set: Θ is preconfigured.

```
QI =[ ], Q^{j+1} = Q^0+j*N_0, t^{j+1} = N_0
for j = 0:( 2^m −1),
    Θ : set of shorten/ punctured bit positions
    for j = N_0 to 1
        q = ⌊"Seq(j)/(N_0/2^m )⌋
        for jj = 1: 2^m
    if Qq+1(t^{q+1})∉ Θ
    QI = [QI, Q^{q+1} (t^{q+1})]
    end
        t^{q+1} = t^{q+1}− 1
        if length(QI)== k: break end
    end
    if length(QI)==k
            break
    end
end
```

A difference between this embodiment of this application and the foregoing method for obtaining the polar code with the code length of $2^m N_0$ lies in that when the polar code with the code length of $2^m N_0$ is constructed based on the sequence with the code length of $N_0$, when the subchannel number determined in the foregoing operation is a subchannel number included in the frozen bit set TT, the subchannel number is determined as a frozen bit, that is, information is not sent in the subchannel number. Therefore, a polar code with any code length may be obtained based on the obtained polar code with the code length of $2^m N_0$.

In this embodiment of this application, a rate matching problem is further resolved based on the foregoing embodiment. The polar code with any code length is constructed by using the short sequence with the length of $N_0$. In this way, a sequence that needs to be stored can be further reduced, a process of constructing a long polar code can be simplified, and complexity is reduced. In addition, the polar code construction method in this embodiment of this application can reuse an existing technology to a maximum extent, and is easy to implement.

Figure 7:
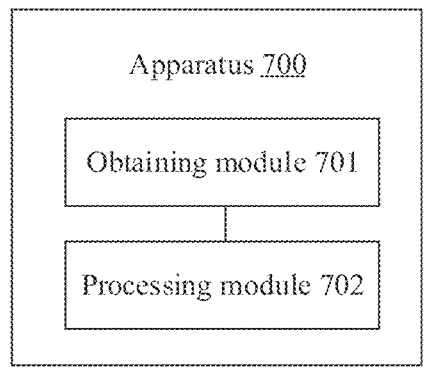
FIG. 7 is a schematic diagram of a polar encoding apparatus according to an embodiment of this application.

FIG. 7 is a schematic diagram of a polar encoding apparatus according to an embodiment of this application. As shown in FIG. 7, the apparatus 700 includes an obtaining module 701 and a processing module 702. The apparatus 700 may be configured to implement an encoding function in any one of the foregoing method embodiments. For example, the apparatus 700 may be a terminal device or a network device that provides a network service for a terminal device.

The apparatus 700 may serve as the terminal device or the network device that provides the network service for the terminal device to process a message, and perform the operation of processing the basic sequence by the terminal device or the network device that provides the network service for the terminal device in the foregoing method embodiments. The obtaining module 701 may be configured to support the apparatus 700 in performing communication, for example, performing an obtaining action performed by the terminal device or the network device that provides the network service for the terminal device in FIG. 5 and FIG. 6. The processing module 702 may be configured to support the apparatus 700 in performing the processing action in the foregoing methods, for example, performing the processing action performed by the terminal device or the network device that provides the network service for the terminal device in FIG. 5 and FIG. 6. Specifically, refer to the following descriptions.

The obtaining module 701 is configured to obtain a basic sequence, where the basic sequence includes $N_0$ subchannel numbers. The processing module 702 is configured to sequentially read first subchannel numbers from the basic sequence. The processing module is further configured to: sequentially read $2^m$ second subchannel numbers from the basic sequence starting from an $M^{th}$ subchannel number based on the first subchannel number read each time; and add $q*N_0$ to each of the $2^m$ second subchannel numbers to obtain $2^m$ third subchannel numbers, and construct a polar code by using $2^m$ subchannels corresponding to the $2^m$ third subchannel numbers as information bits. A code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, and m is an integer greater than or equal to 1.

In some embodiments, M is represented as $t^q$, a value of $t^q$ is obtained by subtracting 1 from a previous value of $t^q$, and an initial value of $t^q$ is $N_0$.

In some embodiments, q is represented as $\lfloor T/(N_0/2^m) \rfloor$, where T indicates the first subchannel numbers read from the basic sequence, and $\lfloor \rfloor$ indicates rounding down.

In some embodiments, the processing module is specifically configured to repeat the operation of reading the $2^m$ second subchannel numbers from the basic sequence until a quantity of read subchannel numbers is equal to the information bit length k of the polar code.

In some embodiments, N is $2^m N_0$.

In some embodiments, N is a code length of any length; the obtaining module is further configured to obtain a set Θ, where the set Θ is determined based on the code rate and the information bit length of the polar code; and the processing module is further configured to construct the polar code based on the $2^m$ third subchannel numbers and the set Θ.

In some embodiments, the set Θ includes at least one of the $2^m$ third subchannel numbers, and the processing module is specifically configured to: determine whether each of the $2^m$ third subchannel numbers is located in the set Θ; and when one of the $2^m$ third subchannel numbers is located in the set Θ, use a subchannel corresponding to the third subchannel number as a frozen bit; or when one of the $2^m$ third subchannel numbers is not located in the set Θ, use a subchannel corresponding to the third subchannel number as an information bit.

In some embodiments, when N is $2^m N_0$, the set Θ is an empty set.

Figure 8:
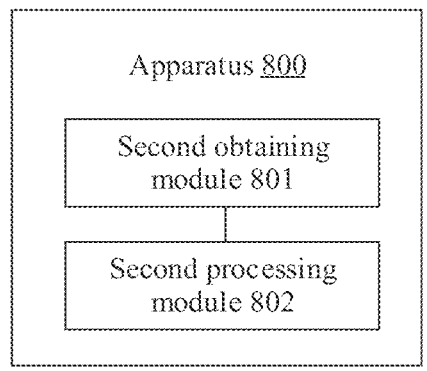
FIG. 8 is a schematic diagram of another polar encoding apparatus according to an embodiment of this application.

FIG. 8 is a schematic diagram of an encoding apparatus according to an embodiment of this application. As shown in FIG. 8, the apparatus 800 includes a second obtaining module 801 and a second processing module 802. The apparatus 800 may be configured to implement an encoding function in any one of the foregoing method embodiments. For example, the apparatus 800 may be a terminal device or a network device that provides a network service for a terminal device.

The apparatus 800 may serve as the terminal device or the network device that provides the network service for the terminal device to process a message, and perform the operation of processing the basic sequence by the terminal device or the network device that provides the network service for the terminal device in the foregoing method embodiments. The second obtaining module 801 may be configured to support the apparatus 800 in performing communication, for example, performing an obtaining action performed by the terminal device or the network device that provides the network service for the terminal device in FIG. 5 and FIG. 6. The second processing module 802 may be configured to support the apparatus 800 in performing the processing action in the foregoing methods, for example, performing the processing action performed by the terminal device or the network device that provides the network service for the terminal device in FIG. 5 and FIG. 6. Specifically, refer to the following descriptions.

The second obtaining module 801 is configured to obtain a first sequence and a second sequence based on a basic sequence, where the basic sequence, the first sequence, and the second sequence each include $N_0$ subchannel numbers. The second processing module 802 is configured to sequentially read fourth subchannel numbers from the basic sequence from back to front. The processing module is further configured to: read two fifth subchannel numbers from the first sequence or the second sequence based on the fourth subchannel numbers read from the basic sequence; and construct a polar code by using the two fifth subchannel numbers read from the first sequence or the second sequence as information bits, where a code length of the polar code is $2N_0$, and an information bit length of the polar code is k.

In some embodiments, the second processing module is specifically configured to: when T is less than $N_0/2$, read an $M^{th}$ subchannel number and a $(M-1)^{th}$ subchannel number from the first sequence; or when T is greater than or equal to $N_0/2$, read a $P^{th}$ subchannel number and a $(P-1)^{th}$ subchannel number from the second sequence.

In some embodiments, M is represented as $t^1$, a value of $t^1$ is obtained by subtracting 2 from a previous value of $t^1$, and an initial value of $t^1$ is $N_0$.

In some embodiments, P is represented as $t^2$, a value of $t^2$ is obtained by subtracting 2 from a previous value of $t^2$, and an initial value of $t^2$ is $N_0$.

In some embodiments, the second processing module is specifically configured to repeat the operation of reading the two fifth subchannel numbers from the first sequence or the second sequence until a quantity of read subchannel numbers is equal to the information bit length of the polar code.

In some embodiments, the second obtaining module is specifically configured to add $(x-1)N_0$ to each subchannel number in the basic sequence, where 1 and 2 respectively indicate a value of x in the first sequence and a value of x in the second sequence.

Figure 9:
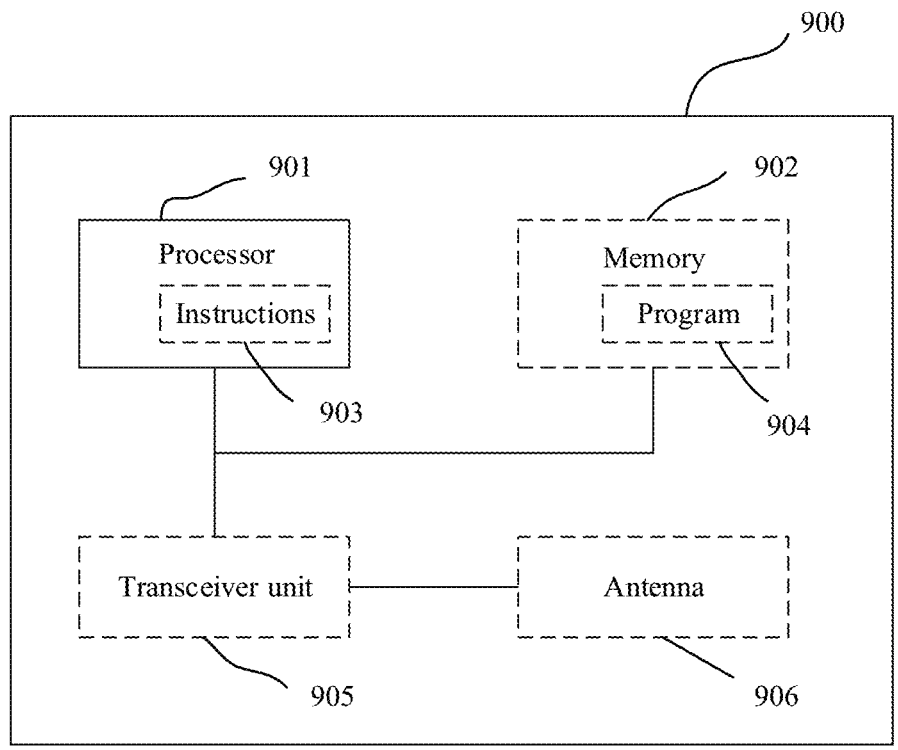
FIG. 9 is another schematic diagram of a structure of a polar encoding apparatus according to an embodiment of this application.

FIG. 9 is a schematic diagram of a structure of a polar encoding apparatus according to an embodiment of this application. The communication apparatus 900 may be configured to implement the encoding method that is related to a terminal device or a network device that may provide a network service for a terminal device and that is described in the foregoing method embodiments. The communication apparatus 900 may be a chip.

The communication apparatus 900 includes one or more processors 901. The one or more processors 901 may support the communication apparatus 900 in implementing the polar encoding methods in FIG. 5 and FIG. 6. The processor 901 may be a general-purpose processor or a dedicated processor. For example, the processor 901 may be a central processing unit (CPU) or a baseband processor. The baseband processor may be configured to process communication data. The CPU may be configured to control the communication apparatus (for example, a network device, a terminal device, or the chip) to execute a software program and process data of the software program. The communication apparatus 900 may further include a transceiver unit 905, configured to input (receive) and output (send) a signal.

Figure 10:
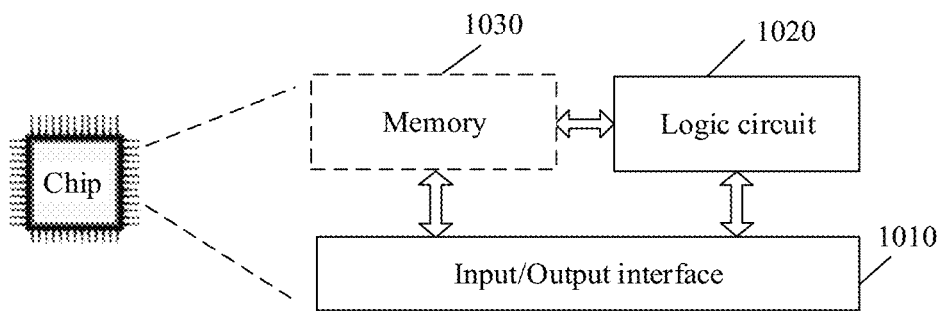
FIG. 10 is a schematic diagram of a structure of a chip of a polar encoding apparatus according to an embodiment of this application.

For example, the communication apparatus 900 may be a chip, and the transceiver unit 905 may be an input circuit and/or an output circuit of the chip. Alternatively, the transceiver unit 905 may be a communication interface of the chip, and the chip may be used as a component of a terminal device, a network device, or another wireless communication device. FIG. 10 is a schematic diagram of a structure of a chip according to an embodiment of this application. As shown in the figure, the chip may include an input/output interface 1010, a logic circuit 1020, and a memory 1030. The memory 1030 is configured to store instructions. The input/output interface 1010 may be configured to receive code instructions or information. For example, the input/output interface 1010 may be configured to input instructions for performing polar encoding by using the basic sequence in the polar encoding methods in FIG. 5 and FIG. 6, or the input/output interface 1010 outputs a polar code encoded by performing the polar encoding methods in FIG. 5 and FIG. 6. The logic circuit 1020 is configured to execute the instructions stored in the memory 1030, or the logic circuit 1020 enables, based on the code instructions or information received from the input/output interface 1010, the chip to implement the polar encoding methods in FIG. 5 and FIG. 6.

The communication apparatus 900 may include one or more memories 902. The memory 902 stores a program 904. The program 904 may be run by the processor 901 to generate instructions 903, so that the processor 901 performs, according to the instructions 903, the methods described in the foregoing method embodiments. In some embodiments, the memory 902 may further store data. In some embodiments, the processor 901 may further read the data stored in the memory 902. The data and the program 904 may be stored at a same storage address, or the data and the program 904 may be stored at different storage addresses.

The processor 901 and the memory 902 may be separately disposed, or may be integrated, for example, integrated on a board or a system on chip (SoC).

The communication apparatus 900 may further include the transceiver unit 905 and an antenna 906. The transceiver unit 905 may be referred to as a transceiver machine, a transceiver circuit, or a transceiver, and is configured to implement receiving and sending functions of the communication apparatus through the antenna 906.

It should be understood that the operations in the foregoing method embodiments may be implemented by using a logic circuit in a form of hardware or instructions in a form of software in the processor 901. The processor 901 may be a CPU, a digital signal processor (DSP), an application-specific integrated circuit (ASIC), or a field-programmable gate array (FPGA) or another programmable logic device such as a discrete gate, a transistor logic device, or a discrete hardware component.

In the several embodiments provided in this application, it should be understood that the disclosed apparatuses and methods may be implemented in other manners. For example, the foregoing described apparatus embodiments are merely examples. For example, division into modules is merely logical function division and may be other division during actual embodiment.

When the method in embodiments of this application is implemented in a form of a software functional unit and sold or used as an independent product, the method may be stored in a computer-readable storage medium. Based on such understanding, the technical solutions or some of the technical solutions in this application may be implemented in a form of a software product. The computer software product is stored in a storage medium and includes several instructions for instructing a computer device (which may be a personal computer, a server, a network device, or the like) to perform all or some of the operations of the methods in embodiments of this application. The storage medium includes at least any medium that can store program code, such as a universal serial bus (USB) flash drive, a removable hard disk, a read-only memory (ROM), a random access memory (RAM), a magnetic disk, or an optical disc. The foregoing descriptions are merely specific embodiments of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A polar encoding method, comprising:
obtaining, by a first device in a communications network, a basic sequence that comprises $N_0$ subchannel numbers;
sequentially reading, by the first device, first subchannel numbers from the basic sequence;
sequentially reading, by the first device, $2^m$ second subchannel numbers from the basic sequence starting from an $M^{th}$ subchannel number based on a first subchannel number being read;
adding, by the first device, $q*N_0$ to each of the $2^m$ second subchannel numbers to obtain $2^m$ third subchannel numbers, and constructing, by the first device, a polar code using $2^m$ subchannels corresponding to the $2^m$ third subchannel numbers as information bits to obtain a desired code length of the polar code, wherein a code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, m is an integer greater than or equal to 1, and N is $2^m N_0$; and
exchanging, by the first device with a second device in the communications network, a communication that uses the polar code for a channel coding scheme.

2. The method according to claim 1, wherein M is represented as $t^q$, a value of $t^q$ is obtained by subtracting 1 from a previous value of $t^q$, and an initial value of $t^q$ is $N_0$.

3. The method according to claim 1, wherein q is determined based on the first subchannel numbers read from the basic sequence; and
q is represented as $\lfloor T/(N_0/2^m) \rfloor$, wherein T indicates the first subchannel numbers read from the basic sequence, $\lfloor \rfloor$ and indicates rounding down.

4. The method according to claim 1, wherein the adding $q*N_0$ to each of the $2^m$ second subchannel numbers to obtain $2^m$ third subchannel numbers, and constructing a polar code by using $2^m$ subchannels corresponding to the $2^m$ third subchannel numbers as information bits comprises:
repeating the reading of the $2^m$ second subchannel numbers from the basic sequence until a quantity of read subchannel numbers is equal to the information bit length k of the polar code.

5. The method according to claim 1, wherein N is a code length of any length, and the method further comprises:

obtaining a set $\Theta$, wherein the set $\Theta$ is determined based on the code rate and the information bit length of the polar code; and
constructing the polar code based on the $2^m$ third subchannel numbers and the set $\Theta$.

6. The method according to claim 5, wherein the set $\Theta$ comprises at least one of the $2^m$ third subchannel numbers, and the constructing the polar code based on the $2^m$ third subchannel numbers and the set $\Theta$ comprises:
determining whether each of the $2^m$ third subchannel numbers is located in the set $\Theta$; and
when one of the $2^m$ third subchannel numbers is located in the set $\Theta$, using a subchannel corresponding to the third subchannel number as a frozen bit; or
when one of the $2^m$ third subchannel numbers is not located in the set $\Theta$, using a subchannel corresponding to the third subchannel number as an information bit.

7. The method according to claim 5, wherein when N is $2^m N_0$, the set $\Theta$ is an empty set.

8. A polar encoding apparatus, comprising:
a memory storing one or more instructions; and
a processor coupled with the memory, configured to execute the one or more instructions, causing the polar encoding apparatus to perform operations, comprising:
obtaining a basic sequence that comprises $N_0$ subchannel numbers;
sequentially reading first subchannel numbers from the basic sequence;
sequentially reading $2^m$ second subchannel numbers from the basic sequence starting from an $M^{th}$ subchannel number based on a first subchannel number being read;
adding $q*N_0$ to each of the $2^m$ second subchannel numbers to obtain $2^m$ third subchannel numbers, and construct a polar code by using $2^m$ subchannels corresponding to the $2^m$ third subchannel numbers as information bits to obtain a desired code length of the polar code, wherein a code rate of the polar code is k/N, k is an information bit length of the polar code, N is a code length of the polar code, q is determined based on the first subchannel numbers read from the basic sequence, a sequence length $N_0$ of the basic sequence, and the code length N of the polar code, q is greater than or equal to 0 and less than or equal to $2^m-1$, m is an integer greater than or equal to 1, and N is $2^m N_0$; and
exchanging, with a second device in a communications network, a communication that uses the polar code for a channel coding scheme.

9. The apparatus according to claim 8, wherein M is represented as $t^q$, a value of $t^q$ is obtained by subtracting 1 from a previous value of $t^q$, and an initial value of $t^q$ is $N_0$.

10. The apparatus according to claim 8, wherein q is represented as $\lfloor T/(N_0/2^m) \rfloor$, wherein T indicates the first subchannel numbers read from the basic sequence, and $\lfloor \rfloor$ indicates rounding down.

11. The apparatus according to claim 8, wherein the processor is configured to execute the one or more instructions to cause the polar encoding apparatus to perform further operations, comprising:
repeating the reading of the $2^m$ second subchannel numbers from the basic sequence until a quantity of read subchannel numbers is equal to the information bit length k of the polar code.

12. The apparatus according to claim 8, wherein N is a code length of any length, and the processor is configured to execute the one or more instructions to cause the polar encoding apparatus to perform further operations, comprising:

obtaining a set $\Theta$, wherein the set $\Theta$ is determined based on the code rate and the information bit length of the polar code; and constructing the polar code based on the $2^m$ third subchannel numbers and the set $\Theta$.

13. The apparatus according to claim 12, wherein the set (comprises at least one of the $2^m$ third subchannel numbers, and the processor is configured to execute the one or more instructions to cause the polar encoding apparatus to perform further operations, comprising:

determining whether each of the $2^m$ third subchannel numbers is located in the set $\Theta$; and when one of the $2^m$ third subchannel numbers is located in the set $\Theta$, using a subchannel corresponding to the third subchannel number as a frozen bit; or when one of the $2^m$ third subchannel numbers is not located in the set $\Theta$, using a subchannel corresponding to the third subchannel number as an information bit.

14. The apparatus according to claim 12, wherein when N is $2^m N_0$, the set $\Theta$ is an empty set.

15. A polar encoding method, comprising:

obtaining, by a first device in a communications network, a first sequence and a second sequence based on a basic sequence, wherein the basic sequence, the first sequence, and the second sequence each comprise $N_0$ subchannel numbers;

sequentially reading, by the first device, fourth subchannel numbers from the basic sequence, and reading, by the first device, two fifth subchannel numbers from the first sequence or the second sequence based on the fourth subchannel numbers read from the basic sequence;

constructing, by the first device, a polar code using the two fifth subchannel numbers read from the first sequence or the second sequence as information bits to obtain a desired code length of the polar code, wherein a code length of the polar code is $2N_0$, and an information bit length of the polar code is k, and wherein the constructing comprises: repeating the reading of the two fifth subchannel numbers from the first sequence or the second sequence until a quantity of read subchannel numbers is equal to the information bit length k of the polar code; and exchanging, by the first device with a second device in the communications network, a communication that uses the polar code for a channel coding scheme.

16. The method according to claim 15, wherein the reading two fifth subchannel numbers from the first sequence or the second sequence based on the fourth subchannel numbers read from the basic sequence comprises:

when T is less than $N_0/2$, reading an $M^{th}$ subchannel number and a $(M-1)^{th}$ subchannel number from the first sequence; or when T is greater than or equal to $N_0/2$, reading a $P^{th}$ subchannel number and a $(P-1)^{th}$ subchannel number from the second sequence.

17. The method according to claim 15, wherein the obtaining the first sequence and the second sequence based on the basic sequence comprises:

adding $(x-1) N_0$ to each subchannel number in the basic sequence, wherein 1 and 2 respectively indicate a value of x in the first sequence and a value of x in the second sequence.

* * * * *

UNITED STATES PATENT AND TRADEMARK OFFICE
CERTIFICATE OF CORRECTION

PATENT NO. : 12,149,261 B2  
APPLICATION NO. : 18/317259  
DATED : November 19, 2024  
INVENTOR(S) : Xianbin Wang et al.

It is certified that error appears in the above-identified patent and that said Letters Patent is hereby corrected as shown below:

In the Claims

In Claim 13, Column 23, Line 9-10, delete "wherein the set (comprises" and insert --wherein the set ⊖ comprises--.

Signed and Sealed this  
Eleventh Day of February, 2025

Coke Morgan Stewart  
*Acting Director of the United States Patent and Trademark Office*